(12) United States Patent
Kulkarni et al.

(10) Patent No.: US 6,294,469 B1
(45) Date of Patent: Sep. 25, 2001

(54) SILICON WAFERING PROCESS FLOW

(75) Inventors: Milind Kulkarni, St. Louis; AnKur Desai, St. Peters, both of MO (US)

(73) Assignee: PlasmaSil, LLC, St. Peters, MO (US)

(*) Notice: Subject to any disclaimer, the term of this patent is extended or adjusted under 35 U.S.C. 154(b) by 0 days.

(21) Appl. No.: 09/512,111

(22) Filed: Feb. 24, 2000

Related U.S. Application Data

(60) Provisional application No. 60/135,260, filed on May 21, 1999.

(51) Int. Cl.[7] .................................................. H01L 21/302
(52) U.S. Cl. ........................ 438/689; 438/691; 438/706
(58) Field of Search .............................. 438/690, 689, 438/706, 719, 745, 753

(56) References Cited

U.S. PATENT DOCUMENTS

| | | | |
|---|---|---|---|
| 3,997,381 | * 12/1976 | Wanlass | 156/3 |
| 4,318,250 | 3/1982 | Klievoneit et al. | 51/134 |
| 4,652,901 | * 3/1987 | Nothaft | 357/40 |
| 4,663,890 | 5/1987 | Brandt | 51/283 |
| 4,668,366 | 5/1987 | Zarowin | 204/192.1 |
| 4,693,036 | 9/1987 | Mori | 51/131.3 |
| 4,753,049 | 6/1988 | Mori | 51/131.3 |
| 4,947,598 | 8/1990 | Sekiya | 51/283 |
| 5,035,087 | 7/1991 | Nishiquichi et al. | 51/131.1 |
| 5,113,622 | 5/1992 | Nishiquchi et al. | 51/165.73 |
| 5,238,532 | 8/1993 | Zarowin et al. | 156/643 |
| 5,254,830 | 10/1993 | Zarowin et al. | 219/121.43 |
| 5,290,382 | 3/1994 | Zarowin et al. | 156/345 |
| 5,291,415 | 3/1994 | Zarowin et al. | 364/474.3 |
| 5,292,400 | 3/1994 | Mumola | 156/643 |
| 5,329,733 | 7/1994 | Steere, Jr. | 51/165.76 |
| 5,336,355 | 8/1994 | Zarowin et al. | 156/345 |

(List continued on next page.)

FOREIGN PATENT DOCUMENTS

| | | |
|---|---|---|
| 0 699 504 A1 | 3/1996 | (EP). |
| 0 755 751 A1 | 1/1997 | (EP). |
| 0 782 179 A2 | 7/1997 | (EP). |
| 0 782 179 A3 | 7/1997 | (EP). |
| 0 798 405 A2 | 10/1997 | (EP). |
| 0 798 766 A1 | 10/1997 | (EP). |
| 09-103944 | 4/1997 | (JP). |

OTHER PUBLICATIONS

Mumola, P. B., et al., Recent Advances in Thinning of Bonded Soi Wafers by Plasma Assisted Chemical Etching, Electrochemical Society Proceedings vol. 95–7, pp 28–32 (1995).

PCT International Publication No. WO 98/19337, International Publication Date May 7, 1998.

PCT International Publication No. WO 98/09804 Publication Date Mar. 12, 1998.

PCT International Publication No. WO 98/44541 Publication Date Oct. 8, 1998.

PCT International Publication No. WO 98/44549 Publication Date Oct. 8, 1998.

*Primary Examiner*—Benjamin L. Utech
*Assistant Examiner*—Kin-Chan Chen
(74) *Attorney, Agent, or Firm*—Senniger, Powers, Leavitt & Roedel

(57) ABSTRACT

A method of processing a semiconductor wafer sliced from a single-crystal ingot and having front and back surfaces and a peripheral edge comprises the step of plasma jet etching the wafer to reduce the sub-surface wafer damage. The method further comprises high-gloss etching the wafer by subjecting the wafer to a high-gloss etchant that smooths the wafer such that surface roughness and nonspecularly reflected light are reduced. Plasma assisted chemical etching (PACE) is performed on the wafer to improve the flatness and the thickness uniformity of the wafer. The wafer is final polished to further reduce surface roughness and nonspecularly reflected light.

13 Claims, 1 Drawing Sheet

U.S. PATENT DOCUMENTS

| | | | |
|---|---|---|---|
| 5,344,524 | 9/1994 | Sharma et al. | 156/630 |
| 5,360,509 | 11/1994 | Zakaluk et al. | 156/645 |
| 5,372,674 | 12/1994 | Steinberg | 156/643 |
| 5,376,224 | 12/1994 | Zarowin | 156/643 |
| 5,419,803 | 5/1995 | Mumula | 216/38 |
| 5,474,647 | 12/1995 | Poultney et al. | 156/626.1 |
| 5,545,076 | 8/1996 | Yun et al. | 451/287 |
| 5,605,494 | 2/1997 | Nishioda et al. | 451/41 |
| 5,679,060 | 10/1997 | Leonard et al. | 451/43 |
| 5,679,212 | 10/1997 | Kato et al. | 156/636.1 |
| 5,688,415 | 11/1997 | Bollinger et al. | 219/121.41 |
| 5,821,166 | 10/1998 | Hajime et al. | 438/691 |
| 5,821,167 | 10/1998 | Fukami et al. | 438/691 |
| 5,827,779 | 10/1998 | Masumura et al. | 438/691 |
| 5,849,603 | 12/1998 | Kato et al. | 438/14 |
| 5,849,636 | 12/1998 | Harada et al. | 438/691 |
| 5,851,924 | 12/1998 | Nakazawa et al. | 438/691 |
| 5,863,829 | 1/1999 | Nakayoshi et al. | 438/459 |
| 5,942,445 * | 8/1999 | Kato et al. | 438/691 |
| 6,030,887 | 2/2000 | Desai et al. | 438/507 |
| 6,184,060 * | 2/2001 | Siniaguine | 438/106 |

* cited by examiner

SILICON WAFERING PROCESS FLOW

This application claims priority of provisional application Ser. No. 60/135,260, filed May 21, 1999.

BACKGROUND OF THE INVENTION

The present invention relates generally to a process flow for processing semiconductor wafers, and, more particularly, to a process flow using a combination of plasma jet etching, high-gloss etching and Plasma Assisted Chemical Etching (PACE).

Semiconductor wafers used as starting materials for the fabrication of integrated circuits must meet certain surface flatness requirements. Such wafers must be an particularly flat in order to print circuits on them (or on layers deposited upon them) by, for example, an electron beam-lithographic or photolithographic process. Wafer flatness in the focal point of the electron beam delineator or optical printer is important for uniform imaging in the electron beam-lithographic and photolithographic processes. The flatness of the wafer surface directly impacts device line width capability, process latitude, yield and throughput. The continuing reduction in device geometry and increasingly stringent device fabrication specifications are forcing manufacturers of semiconductor wafers to prepare increasingly flatter wafers.

Wafers can be characterized for flatness in terms of a global flatness variation parameter (for example, "GBIR") or in terms of a local site flatness variation parameter (for example, Site Best Fit Reference Plane ("SFQR") or Site Total Indicated Reading, Back Reference Center Focus ("SBIR")). A more detailed discussion of the characterization of wafer flatness can be found in F. Shimura, *Semiconductor Silicon Crystal Technology* (Academic Press 1989), pp. 191–195.

GBIR, frequently used to measure global flatness variation, is the difference between the maximum and minimum thicknesses of the wafer. GBIR in the wafer is an important indicator of the quality of the polish of the wafer. SBIR, frequently used to measure local site flatness variation, is the sum of the maximum positive and negative deviations of the surface in a small area of the wafer from a theoretical reference plane which is approximately parallel to the back surface of the wafer and intersects the front surface at the center of the local site. SFQR, which is becoming more widely used to measure local site flatness variation, is the sum of the maximum positive and negative deviations of the surface in a small area of the wafer with reference to a best fit reference plane.

Semiconductor wafers are generally prepared from a single crystal ingot, such as a silicon ingot, which is trimmed and ground to have one or more flats for proper orientation of the wafer in subsequent procedures. The ingot is then sliced into individual wafers which are each subjected to a number of processing operations to flatten the wafer, remove damage, and to create a highly reflective surface. Typically, the peripheral edge of each wafer is rounded to reduce the risk of wafer damage during further processing. In a conventional process flow, each wafer is then lapped to improve thickness uniformity, to reduce saw damage and to reduce waviness in the wafer. The wafer may also be subjected to a rough grinding operation to remove damage caused by slicing. The wafer is then etched to smooth the surfaces and rough polished to polish and flatten the surfaces before undergoing final polishing and cleaning processes.

The conventional process flows are limited in the degree of wafer flatness and in the yield of acceptable wafers. This is due in part to the fact that the rough polishing operation often does not satisfactorily flatten the wafer. A conventionally rough polished wafer ideally has a SBIR of about 0.4 microns for any 20 mm×20 mm local site and a SFQR of about 0.18 microns for any 25 mm×32 mm local site (as disclosed in *The National Technology Roadmap for Semiconductors: Technology Needs*, published by the Semiconductor Industry Association, p.64 (1997 edition). Such values, however, depend upon actual process conditions and often are significantly larger than 0.4 microns. Indeed, only a small percentage of wafers in a conventionally processed group of wafers meets the above ideal flatness specification. The wafers that do not meet this flatness specification are often rejected. Moreover, there are certain disadvantages of the lapping, grinding and rough polishing operations which increase the cost of processing semiconductor wafers. Conventional lapping machines are not automated, which increases the manual labor involved and the time required for the operations. Polishing is a slow process and requires a relatively long time to remove material from the wafer. Thus, more polishing machines are needed to increase the volume or throughput of wafers. Expensive consumables (e.g., slurries, pads) are used in each lapping and rough polishing operation. While rough grinding has certain advantages over lapping, rough grinding is not completely satisfactory because it generally causes deeper crystal lattice damage than lapping, resulting in a lesser quality wafer and an increased risk of fracturing of the wafer. Additionally, low-frequency flatness parameters such as waviness are not efficiently improved by grinding alone. Therefore, there is a need for a new process flow capable of improving the flatness of a semiconductor wafer, the yield of a given production run, and the cost efficiency of the process flow.

SUMMARY OF THE INVENTION

Among the several objects and features of the present invention may be noted the provision of a method of processing a semiconductor wafer which produces a wafer having flat surfaces; the provision of such a method which does not require lapping; the provision of such a method which does not require rough polishing; the provision of such a method which does not require grinding; the provision of such a method which produces a wafer of relatively uniform global and local thickness; and the provision of such a process which is economical for use in processing wafers.

Generally, a method of processing a semiconductor wafer sliced from a single-crystal ingot and having front and back surfaces and a peripheral edge comprises the step of plasma jet etching the wafer to reduce the sub-surface wafer damage. The method further comprises high-gloss etching the wafer by subjecting the wafer to a high-gloss etchant that smooths the wafer such that surface roughness and nonspecularly reflected light are reduced. Plasma assisted chemical etching (PACE) is performed on the wafer to improve the flatness and the thickness uniformity of the wafer. The wafer is final polished to further reduce surface roughness and nonspecularly reflected light.

In another aspect of the invention, a method of manufacturing a semiconductor wafer includes the step of slicing a single-crystal ingot to form a wafer having front and back surfaces and a peripheral edge. Plasma jet etching is performed on the wafer to reduce the sub-surface wafer damage. The wafer is high-gloss etched by immersing the wafer in a high-gloss etchant that smooths the wafer such that surface roughness and nonspecularly reflected light are reduced. Plasma assisted chemical etching (PACE) is performed on the wafer to improve the flatness and the thickness uniformity of the wafer. The wafer is final polished to further reduce surface roughness and nonspecularly reflected light and the wafer is cleaned and packaged for shipment. The processing of the wafer is free of any rough polishing, lapping or grinding steps between the steps of slicing and packaging.

Other objects and features of the present invention will be in part apparent and in part pointed out hereinafter.

DETAILED DESCRIPTION OF THE PREFERRED EMBODIMENT

Figure 1:
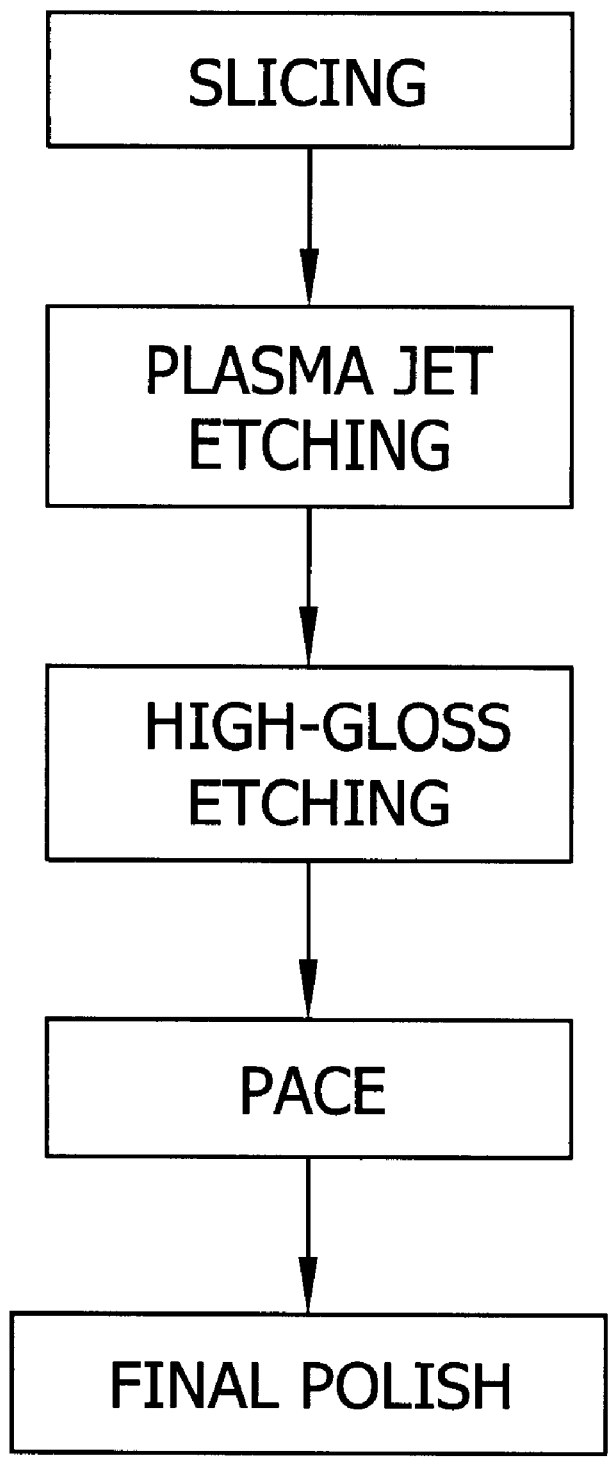
FIG. 1 is a flow diagram showing a method of manufacturing a semiconductor wafer in accordance with the present invention.

In the preferred method of this invention, a semiconductor wafer is processed using a combination of plasma jet etching, high-gloss etching and plasma-assisted chemical etching steps. This method produces a flat wafer having relatively uniform thickness without requiring a rough polishing, grinding or lapping operation.

The semiconductor wafer is sliced from a single-crystal ingot, such as by using a conventional inner diameter saw or conventional wire saw, to have a predetermined initial thickness. The sliced wafer is generally disk-shaped and has a peripheral edge and opposing front and back surfaces. For purposes of this description, the front surface is the surface upon which devices are ultimately printed. The initial thickness of each wafer is substantially greater than the desired end thickness to allow subsequent processing operations to reduce the thickness of the wafer without the risk of damaging or fracturing the wafer. As an example, the initial thickness may be in the range of about 800–1200 microns.

After slicing, the wafer is subjected to cleaning to remove particulate matter deposited on the wafer from the slicing operation. The peripheral edge of the wafer is profiled (e.g., rounded) by a conventional edge grinder (not shown) to reduce the risk of damage to the wafer during further processing. The wafer is again cleaned to remove particulate matter deposited on the wafer from the edge grinding operation. The wafer may be laser marked prior to the next operation.

The wafer is then placed in a plasma jet etching apparatus for plasma jet etching the front and back surfaces to reduce the sub-surface wafer damage. A suitable apparatus is referred to by the tradename PACEJET II and manufactured by IPEC/Precision, Inc. of Bethel, Conn. Briefly, the plasma jet etching operation includes loading several wafers into a rotatable wafer carrier and inserting the carrier in the apparatus. The apparatus includes a cathode, an anode and a magnet which operate to create a plasma generation zone when a reactant gas is introduced under pressure. The plasma is forced by the gas pressure against one of the wafer surfaces. The carrier is rotated to place another of the wafers in contact with the plasma. The process is continued so that the plasma jet etching operation removes material from one surface of each of the wafers. The carrier is thereafter removed from the apparatus, turned over and reinserted in the apparatus and the opposite surface of each wafer is plasma jet etched. Preferably, about 70–100 microns of wafer material is removed from each wafer in the plasma jet etching operation. More preferably, about 80–90 microns of wafer material is removed.

The wafer is then subjected to a high-gloss etching operation in which the surface of the wafer is etched with an aqueous solution comprising hydrofluoric acid (HF) and an oxidizing agent which consistently yields a wafer surface having improved gloss and smoothness. A preferred high-gloss etching operation is described in D. G. Schimmel, J. ELECTROCHEM. SOCIETY, *Solid State Science and Technology*, Vol. 123, no. 5, pp. 734–741 (1976), and a more preferred etching operation is described in a co-assigned application filed this day by the following inventors: Henry F. Erk and Anca Stefanescu, and described in more detail hereinafter. The co-assigned application is incorporated herein by reference. In this preferred microetching operation, the total thickness of the wafer is reduced by about 2–30 microns and more preferably by about 2–20 microns. Wafers produced by the etching process preferably have an average roughness comparable to that of a polished wafer.

Generally speaking, suitable oxidizing agents for the etching process are manganese and chromium based; more specifically, suitable oxidizing agents include those capable of forming permanganate ions ($MnO_4^-$), chromate ions ($CrO_4^{2-}$), and dichromate ions ($Cr_2O_4^{2-}$) in solution, as well chromium trioxide ($CrO_3$) and mixtures thereof. Oxidizing agents capable of forming permanganate ions in solution, such as potassium permanganate ($KMnO_4$) or sodium permanganate ($NaMnO_4$), are preferred, in part due to their less hazardous nature.

The aqueous etching solution typically comprises between about 10 and about 49 weight percent hydrofluodic acid, and between about 0.2 and about 6 weight percent of an oxidizing agent. Preferably, the aqueous solution comprises between about 30 and about 40 weight percent hydrofluoric acid, and between about 1 and about 2 weight percent of an oxidizing agent. Most preferably, however, the aqueous solution comprises between about 30 and about 35 weight percent hydrofluoric acid and between about 1 and about 1.5 weight percent of an oxidizing agent. In one preferred embodiment, the aqueous solution comprises about 33 weight percent hydrofluoric acid and about 1 weight percent potassium permanganate.

Usually, the hydrofluoric acid and oxidizing agent are dissolved in water forming an aqueous HF solution and an aqueous oxidizing agent solution and then the solutions are mixed together to produce an etching solution with the desired composition. For example, a typical aqueous HF solution will consist essentially of water and about 49 weight percent hydrofluoric acid. Whereas the oxidizing agent is generally added to the etching solution as a 1 N aqueous solution. The two solutions are then mixed to form an etching solution wherein the weight ratio of oxidizing agent to hydrofluoric acid is from about 0.01 to about 0.1. Preferably, the weight ratio of oxidizing agent to hydrofluoric acid is from about 0.03 to about 0.05. The ratio of oxidizing agent to hydrofluoric acid determines the etch rate of the solution, the gloss and roughness of an etched wafer. However, it is to be understood that the concentration of hydrofluoric acid and the oxidizing agent in the present aqueous etching solution may be other than that herein described without departing from the scope of the present invention.

Referring now to Equation (1) and (2), the etching process will be further described, wherein potassium permanganate is utilized as the oxidizing agent. Without being held to any particular theory, it is generally believed that etching proceeds with the potassium permanganate ($KMnO_4$), or rather permanganate ion ($MnO_4^-$), oxidation of silicon (Si) on the wafer surface to form silicon dioxide ($SiO_2$). The silicon dioxide is then dissolved by the hydrofluoric acid (HF).

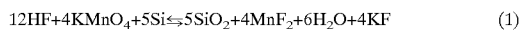  (1)

  (2)

The etchant solution may be employed in a number of different techniques common in the art in order to etch the wafer surface. For example, one technique, referred to as spin etching, is disclosed in U.S. Pat. No. 4,903,717. The spin etching technique comprises rotating the wafer while a continuous stream of etchant is applied to the top of the wafer. Another technique is spray etching, wherein a continuous spray of etchant is applied to the wafer surface.

Preferably, however, the etching process comprises fully immersing the wafer into a bath of the etchant solution. Although one wafer at a time may be immersed in the solution, preferably a number of wafers (e.g., 25 or more) will be assembled in a cassette, or wafer carrier, and immersed at the same time in the solution. When such a carrier is used, however, certain portions of each stationary wafer will be in constant contact with the carrier, resulting in nonuniform etching across the surface of each wafer. To eliminate this problem and provide a more uniform result over the entire wafer surface, the wafers are preferably rotated while immersed in the etchant solution.

Furthermore, because the wafers are closely spaced, typically between about 4 mm to about 7 mm apart, rotation of the wafers tends to produce a rigid-body rotation of the liquid between the wafers. As a result, stagnation of the etchant solution between the wafers typically occurs. Stagnation is a concern because acid etching of silicon is believed to be at least in part dependent upon the mass transfer resistance at the silicon-etchant interface. As the etching reaction proceeds, the concentrations of acid and oxidizing agent decrease at the interface and the concentration of reaction products increases. Accordingly, nonuniform etching results may be obtained not only across the surface of a given wafer, but also from one wafer surface to the next within the set of wafers in the wafer carrier.

In order to produce uniformly etched wafers and to ensure consistent results from one set of wafers to the next, it is preferred that the etchant solution be if continuously mixed or agitated for the duration of the etching process. Bath agitation or mixing may be achieved by means known in the art, such as by employing ultrasonic agitation, stirring devices and pumps. Preferable, however, agitation is achieved by passing or "bubbling" a gas through the etchant solution (see, e.g., U.S. Pat. No. 5,340,437). Generally, any gas which will not react with the wafer surface may be employed, including elemental gases (e.g., hydrogen, nitrogen, oxygen), noble gases (e.g., helium or argon) or compound gases (e.g., carbon dioxide).

It is to be noted that, in addition to the gas bubbles introduced into the etchant solution as a result of gas agitation, gas bubbles may also be formed via the etching reaction itself. More specifically, as the etchants of the present process react with the wafer surface, hydrogen gas evolves, creating hydrogen bubbles in the etching bath. These bubbles tend to adhere to the wafer surface and may interfere with the action of the etchant, resulting in nonuniform etching and possibly surface staining. The effect of bubbles, mass transfer resistance and kinetic resistance on the wafer surface etched by isotropic etching processes was theoretically and experimentally explained by Kulkarni, M. S. and H. F. Erk at the annual AIChE Conference held in Los Angeles in 1997 and in "Wet Etching of Silicon Wafers: Transport and Kinetic Effects," Kulkarni, M. S. and H. F. Erk, Paper 124f, AIChE Conference, Los Angeles (1997), which is incorporated herein by reference.

Kulkarni and Erk developed theoretical. relationships between effect of bubbles known as "bubble masking", mass transfer resistance and the kinetic resistance. They also showed, both theoretically and experimentally, that the effect of bubbles (bubble masking) and polishing efficiency of an isotropic etching process can be increased or decreased by varying kinetic resistance or mass transfer resistance or both. In essence the intensity of bubble masking was shown to be simply a function of these resistances which in turn are functions of many variables such as process parameters and etching mixture composition.

The effects of these bubbles can be minimized by the addition of a surfactant to the etchant solution. Without being held to any particular theory, it is generally believed that the surfactant acts as a wetting agent, reducing the surface tension of the aqueous solution on the surface of the wafer and thus preventing the gas bubbles from adhering thereto. Furthermore, it is believed that the surfactant stabilizes the size of the bubbles in the bath, which also helps to produce a smoother and more uniform surface and thus provide more consistent etching results.

Any surfactant that is stable in the presence of the oxidizing agent can be added to the etching solution. For example, a potassium fluoroalkyl carboxylate surfactant sold under the trade designation FC-129 (commercially available from 3M Corporation; St. Paul, Minn.), or sodium dodecyl sulfate can be added to the etchant solution. Experience to-date, however, suggests that a smoother, more uniformly etched surface may be obtained if fluoroalkyl sulfonate surfactants, Such as ammonium perfluoroalkyl sulfonate and potassium perfluoroalkyl sulfonate (sold under the respective trade designations FC-93 and FC-95; commercially available from 3M Corporation; St. Paul, Minn.) are added to the solution.

When added to the etching solution, generally speaking a quantity of surfactant will be used which is sufficient to prevent the adherence of gas bubbles on the surfaces of the wafer. As further described in the Examples, below, wafers may be analyzed in a way which allows for the clear detection of imprints left by bubbles which adhere to the wafer surfaces. Typically, the aqueous etch solution comprises about 0.05 to about 1 weight percent of the surfactant. Preferably, the etch solution comprises about 0.1 to about 0.5 weight percent, and more preferably from about 0.15 to about 0.25 weight percent of the surfactant. In one preferred embodiment, the aqueous etch solution comprises about 0.2 weight percent of a fluoroalkyl sulfonate surfactant. It is to be understood, however, that the concentration of surfactant in the present aqueous etching solution may be other than that herein described without departing from the scope of the present invention.

As previously noted, a heretofore known limitation of etchant solutions employing the oxidizing agents discussed is the inability to regenerate or recondition these solutions. The introduction of additional reagents results in the build-up of salts in the etch bath. The build-up of solids in the etch bath interferes with the etching process. This interference may be due to the salts becoming deposited on the wafer surface, thus acting as a mask and causing non-uniform results. Salts may act to reduce the oxidizing capacity of the reagents.

Without being held to any particular theory, experience to-date suggests that the etchants may be regenerated or reconditioned by restoring the oxidation state of the a reagents, or more specifically the ions, responsible for oxidizing the surface of the silicon wafer as part of the etching process. For example, referring specifically to permanganate-based etchants, it is to be noted that a freshly prepared etchant solution is typically transparent with a deep purple hue. This purple hue is believed to be attributable to the presence of permanganate ions in solution. With the passage of time, and as the number of wafers etched in the solution increases, the color of this solution changes, typically becoming purple/brown. It is believed that this color change reflects the degradation of the otchant solution due to a consumption of permanganate ions in solution.

The consumption of permanganate ions in solution, and thus the degradation of the etchant, is generally believed to be attributable to three potential causes. First, as mentioned above, a portion of the etching reaction entails oxidizing the silicon on the wafer surface with the permanganate-based agent or, more specifically, the permanganate ions ($MnO_4^-$), to form silicon dioxide. The formation of silicon dioxide may be explained by the Equations (3), (4) and (5), below:

$$6H^+ + 4MnO_4^- + 5Si \leftrightarrows 5SiO_2 + 4Mn^{2+} + 6OH^- \quad (3)$$

$$Mn^{7+} \rightarrow Mn^{2+} \quad (4)$$

$$Si^0 \rightarrow Si^{4+} \quad (5)$$

As can be seen from these Equations, during the oxidation of the silicon at the wafer surface, the oxidation state of the solute manganese is reduced from +7 to +2 and the oxidation state of the silicon is increased from 0 to +4. As the etching reaction proceeds, the concentration of $Mn^{7+}$ ions in the bath decreases resulting in the diminished oxidation/etching ability of the bath. However, while the oxidation state of manganese will typically be reduced directly from +7 to +2, a portion of the manganese may alternatively be reduced from +7 to +4. It is believed that manganese in the +4 oxidation state in the etching solution tend to form manganese dioxide ($MnO_2$). Referring now to Equations (6), (7) and (8), the formation of manganese dioxide in the etching process may be explained as follows:

$$4KMnO_4 + 3Si + 4HF \leftrightarrows 3SiO_2 + 4MnO_2 + 2H_2O + 4KF \quad (6)$$

$$Mn^{7+} \rightarrow Mn^{4+} \quad (7)$$

$$Si^0 \rightarrow Si^{4+} \quad (8)$$

The formation of manganese dioxide is generally believed to degrade the etching bath because it can precipitate out of solution and prevent the manganese from further oxidizing silicon. Additionally, precipitated manganese dioxide can be deposited on the wafer and mask the surface from the etching action.

A second potential cause of etchant degradation is the strong ionizing power of water. It is generally believed that water molecules can slowly break down the permanganate ion ($MnO_4^-$) into $MnO_3^{2-}$ and $O^{2-}$ ions, or into $MnO_2$ and $O_2$. This phenomenon usually occurs in dilute acidic solutions, such as the etchant solutions discussed.

Lastly, the third potential cause of etchant degradation is believed to be the tension exerted by water molecules upon the permanganate ions. It is generally believed that this tension can cause the breakdown of these ions. In dilute solutions, such as the etchant solutions discussed, permanganate ions can be hydrolyzed and decomposed into a colloidal solution of manganic hydroxide ($MnO(OH)_2$) and free oxygen. This action occurs under all conditions, but exposure to ultraviolet light and sunlight has been reported to dramatically increase the rate Of hydrolyzation.

In accordance with the etching process, the etchant solution may be reconditioned or regenerated by restoring the oxidizing ability of agents in the solution. For example, the permanganate-based otchant3 are reconditioned by increasing the oxidation state of degraded (i.e., reduced oxidation state) manganese to the +7 oxidation state, which in turn results in the reformation of permanganate ion ($MnO_4^-$). Therefore, the addition of fresh reagents may be avoided, along with the related build as up of salts and other unwanted contaminants.

Generally speaking, the etch solution may be reconditioned or regenerated by contacting the spent or reduced oxidizing agent or solute with any agent capable of returning the oxidation state of the solute to its original level. For example, theoretically the spent agent may be re-oxidized simply by contacting the etch solution with oxygen. Preferably, however, the spent agents, and thus the etching solution itself, is reconditioned in one embodiment of the present invention by contacting the etchant solution with ozone. Typically, the dose of ozone introduced into the solution is greater than the dose which is the stoichiometric equivalent of the spent oxidizing agent or solute; that is, reconditioning of the etchant solution is achieved by introducing into the solution a quantity of oxygen or ozone greater than the stoichiometric equivalent quantity, relative to the spent oxidizing agent or solute. In fact, it is preferred than a dose of about twice the stoichiometric amount or more be added to the etchant solution. It should be noted, however, that higher levels of the agent added to regenerate the spent oxidizing agent may be required if the etchant solution contains other compounds or reagents that may also be oxidized by the agent being added.

As an example of the foregoing, to increase the oxidation state of the solute manganese, typically an amount of ozone greater than about 0.9 mg per mg of manganese is added to the etchant solution. Preferably, however, an amount greater than about 2 mg, and more preferably about 2.5 mg to about 10 mg, of ozone will be added. In this regard it is to be noted that the oxidation of $Mn^{2+}$ to $Mn^{7+}$ may be visually detected because this oxidation results in the reformation of $MnO_4^-$, which results in a color change in the bath from purple-brown to purple. It is also to be noted that if an insufficient quantity of ozone is added to the solution, solute $Mn^{2+}$ ions may be oxidized to an oxidation state less than $Mn^{7+}$. These lesser oxidized manganese ions may eventually hydrolyze and form manganese dioxide, which can precipitate out of solution. Furthermore, if ozone-depleting substances such as nitrites or sulfides are present in the etchant solution, additional ozone may be required.

The etchant may be contacted with ozone in one of several ways by means known in the art, including: 1) injecting gaseous ozone directly into the etching bath, similar to nitrogen gas injection, or 2) by using a packed tower or hollow fiber gas-liquid contactor (commercially available from Hoechst Celanese and W. L. Gore & Associates). The first approach is preferred if the reconditioning ozone is also being used to agitate the bath. However, the second approach may be preferred if a surfactant is present in the etch bath because the bubbling action caused by gas injection may result in excessive foaming, which is detrimental to the etching process.

It is to be noted that chemical oscillators, (see, e.g., A. Nagy "Design of a Permanganate Chemical Oscillator with Hydrogen Peroxide", J. Phys. Chem., vol. 93, pp. 2807–28 (1989)) may be added to the etchant solution as a means by which to prevent the formation of manganese dioxide precipitates. Without being held to any particular theory, it is generally believed that chemical oscillator agents are capable of complexing with or binding to colloidal manganese dioxide to prevent its precipitation, thus allowing all manganese oxidation states to remain in solution. Such agents could be utilized in conjunction with, for example, ozone to further prolong the lifetime of the etchant solution.

As an alternative to the use of chemical oscillators, phosphoric acid ($H_3PO_4$) may be added to the etchant solution. More specifically, phosphoric acid may be added to the solution to prevent manganese dioxide from precipitating in much the same way as the above-noted chemical oscillators. Accordingly, a quantity of phosphoric acid will be added which is sufficient to complex with the manganese dioxide that is formed and maintain it in solution. More specifically, the originally prepared etchant will comprise about 1 to about 10 weight percent phosphoric acid. Preferably, however, the amount of phosphoric acid added is about 1 to about 5 weight percent. The phosphoric acid is generally added to the etchant as an aqueous solution such as an 85 weight percent $H_3PO_4$ solution.

It is believed that, as an alternative embodiment for reconditioning the oxidizing agents of the present invention, potassium persulfate and sulfuric acid may be added to the etchant solution. Without being held to a particular theory, the proposed regeneration mechanism of the permanganate-based etchant solution is represented by Equations (9) through (12), below.

$$K_2S_2O_8 + H_2SO_4 \rightarrow H_2S_2O_8 + K_2SO_4 \qquad (9)$$

$$4H_2O + 3H_2S_2O_8 + 2MnO_2 \rightarrow 2HMnO_4 + 6H_2SO_4 \qquad (10)$$

$$(S_2^{7+}O_8)^{2-} \rightarrow 2(S^{6+}O_4)^{2-} \qquad (11)$$

$$(Mn^{4+}O_2) \rightarrow (Mn^{7+}O_4)^{-} \qquad (12)$$

Referring to Equation (9), the potassium persulfate and the sulfuric acid react to form peroxydisulfuric acid and potassium sulfate. In Equation (10), the peroxydisulfuric acid oxidizes the manganese dioxide to form hydrogen permanganate and sulfuric acid. The oxidation of $Mn^{2+}$ to $Mn^{7+}$ results in the reformation of $MnO_4^-$ which is visible by the color change in the bath from purple-brown to purple.

In view of the above, the potassium persulfate and sulfuric acid would typically be added in about equal molar amounts. Furthermore, each of these compounds would typically be added in about a 1:1 to about 1.5:1 molar ratio, relative to the amount of manganese dioxide in solution. Accordingly, to sufficiently recondition the permanganate-based etchant, about 3 to about 10 weight percent potassium persulfate and about 1 to about 5 weight percent sulfuric acid would be added to the bath. Preferably, however, about 3 to about 5 weight percent potassium persulfate and about 1 to about 3 weight percent sulfuric acid would be added. The potassium persulfate would generally be added to the etchant in powder form (the purity of $KSO_4$ powder is typically about 99% or more), while the sulfuric acid would typically be added as about a 95 weight percent $H_2SO_4$, aqueous solution.

It is to be noted that the potassium persulfate and sulfuric acid method of reconditioning in theory would be a preferred embodiment in situations where the introduction of gaseous ozone to a permanganate-based etchant would cause excessive foaming, such as when a surfactant is present in solution.

It is to be further noted that the previous reconditioning reaction can be accomplished by directly adding peroxydisulfuric acid, which is commercially available, in place of the potassium persulfate and sulfuric acid combination. To sufficiently recondition the permanganate-based etchant in this way, typically about 2 to about 10 weight percent peroxydisulfuric acid is added. Preferably, however, about 2 to about 5 weight percent peroxydisulfuric acid is added.

The timing of the regeneration step, or rather the timing of the addition of reagents to re-oxidize the spent oxidizing agent or solute, is at least in part a function of the type of regeneration process employed. For example, generally the addition of these reagents may be timed based on the visual appearance of the etch solution, the addition occurring as the solution color changes from purple in color to a purple-brown. Alternatively, to ensure a more efficient process and prevent unnecessary delays, the addition may be continuous (such as when ozone is used to agitate the solution) or it may be performed after each cassette of wafers is removed from the solution. In addition, by closely monitoring wafer thickness before and after the etching process, the amount of silicon being removed may be determined. Using the above Equations, the amount of oxidizing agent being consumed may be determined, which in turn can be used to calculate the precise amount of "re-oxidizing" agent to be added at any given time.

Preferably an incoming wafer will have a GBIR of about 1–5 microns. It is to be noted, however, that the etching process may be performed on wafers having other than the GBIR and roughness values as herein described without departing from the scope of the present invention.

Prior to etching the incoming wafer, it is preferred that the wafer be pre-treated, ensuring that both surfaces of the wafer surface is clean, passivated, and free of residue. This pre-treatment can be accomplished by any means known in the art (see, e.g., U.S. Pat. No. 5,593,505).

The etchants described are particularly effective at reducing roughness. The etching process typically involves contacting the wafer surface with the aqueous etchant solution for about 1 to about 30 minutes. Preferably, however, the wafer is contacted for about 2 to about 5 minutes.

It is believed that the etching process allows a level of roughness and gloss to be attained which is generally equivalent to that of rough polishing, while removing significantly less silicon compared to nitric acid based etchants. For example, removing about 10–15 microns of silicon from each side of a wafer with a nitric acid-based etchant produces a surface roughness of about 0.08 to about 0.13 microns Ra (Ra being a measure of micro roughness well known in the art). In contrast, etchants described herein achieve the same roughness by removing less than about 8 μm, and preferably only about 2 microns to about 5 microns from each surface. Etchants described herein can achieve roughness of less than about 0.01 microns Ra by removing 15–30 microns from each surface, which is comparable to the roughness of a rough polished wafer. This relatively small amount of silicon removal is why the present process may be referred to as "micro-etching". Preferably, the etching process will yield a wafer having a roughness of about 0.02 to about 0.1 microns Ra. More preferably, the micro-etched wafer will have a roughness of about 0.01 to about 0.02 microns Ra. Ultimately, the etching process may yield a wafer having roughness which is about 0.01 microns Ra or less.

The results of the present process are comparable to conventional polishing processes, which are typically performed following a standard etching step. One method of polishing is a mechanochemical process, wherein a polishing pad and polishing solution are involved (see, e.g., U.S. Pat. No. 5,377,451), which yields a wafer with a roughness of about 0.001 microns Ra while removing about 7 to about 15 microns silicon from the wafer surface. Accordingly, it is also believed that the etching process can also reduce manufacturing costs by yielding a wafer of a quality similar to a wafer that has been polished, effectively eliminating the cost and time associated with that step in the wafer manufacturing process. For example, a mechanochemical process utilizing a slurry comprising the permanganate-based etchants and optional standard particulate matter could produce a finished wafer in less time because of boundary layer thinning and with less silicon removed than when the acid etching and polishing operations are performed separately. These etchants could be applied as a slurry to a polishing pad in accordance with standard polishing processes. This integration of acid etching and mechanical polishing would attain a low degree of surface roughness through the combined chemical effect of the present etchants and mechanical effect of the particulate/polishing pad.

However, it is to be noted that if the etching process were to be utilized as a replacement for standard polishing techniques, improvements in existing polishing pads would likely be required. Such improvements would be needed if the present process were to be so utilized for commercially practical periods of time because standard acid-resistant pads will not typically withstand the particulate abrasion which occurs on the pad surfaces for a period of time sufficient to make the process economically feasible. Likewise, pads capable of withstanding the abrasion which occurs typically cannot resist the extremely corrosive hydrofluoric acid environment. Accordingly, until polishing pad technology can produce pads With sufficient acid and abrasion resistance, the benefits of integrating the etchants discussed with the polishing step cannot be fully realized.

The etching process is typically performed at room temperature (i.e., about 20° C. to about 25° C.); that is, typically the etching process is carried out at room temperature and without the application of heat. Although temperatures in the range of about 25° C. to about 45° C. may be employed, it is to be noted that experience to-date suggests temperature generally does not play a significant role in the present etching process.

After the etching operation, a PACE operation is performed as disclosed in coassigned application Ser. No. 09/030,912, filed Feb. 26, 1998, incorporated herein by reference. The PACE operation flattens the wafer and improves thickness uniformity in the wafer. Briefly, point-by-point thickness profile data is generated for the wafer in the PACE operation and mapped as a function of position on the front surface of the wafer. The profile data is generated at a suffcient number of discrete positions (typically, several thousand discrete positions) to assure full surface coverage for the wafer.

A thickness measurement tool is used to generate this data. The tool may be a capacitance, optical interference, FTIR, or mechanical (e.g., micrometer) thickness measurement tool. Preferably, however, it is determined using a capacitance thickness measurement tool having a resolution of at least about 0.5 microns and more preferably a resolution of about 0.1 microns. A suitable capacitance measurement tool is commercially available from ADE Corporation, Newton, Mass., under the ULTRAGAGE trademark, such as the ULTRAGAGE 9700, and from IPEC Precision, Inc., Bethel, Conn., under the AcuFlat trademark. In operation, the introduction of a silicon wafer in the airgap of a parallel plate capacitor of these tools causes a change in capacitance. This capacitance change can be related to the thickness of the wafer and its effective dielectric constant.

The reduction in GBIR, SBIR and/or SFQR of the wafer can be calculated using an algorithm which operates on the thickness profile data and a target thickness value for the wafer, $T_t$. For example, the amount of material to be removed can be determined by subtracting the target thickness, $T_t$, from the thickness profile data at each discrete position with the difference between the two values constituting the amount of stock which must be removed at each position on the front surface of the wafer to achieve the target thickness, $T_t$, and thereby minimize GBIR, SBIR and/or SFQR.

Once the amount of material to be removed from each position of the wafer is determined, this information is processed and converted to a dwell time versus position map which is used to control a stock removal tool during a stock removal step. This stock removal step may be executed using any tool which is capable of locally and precisely removing stock from small regions of the front surface of the wafer. The tool may be, for example, a chemical/mechanical polishing tool having micropolishing heads. Preferably, however, it is a PACE removal tool of the type described in U.S. Pat. Nos. 4,668,366, 5,254,830, 5,291,415, 5,375,064, 5,376,224, and 5,491,571, which are commercially available from IPEC/Precision, Inc., such as Model No. PWS-200/300.

After the PACE stock removal step, the wafer has a GBIR of less than 1 microns and more preferably a GBIR of less than about 0.4 microns. Additionally, the wafer has a SBIR for any 20 mm by 20 mm local site of less than 0.7 microns, more preferably less than about 0.4 microns, and still more preferably less than about 0.25 microns. The wafer has an SFQR for any 25 mm×25 mm local site of less than about 0.4 microns, more preferably less than about 0.18 microns, more preferably less than about 0.13 microns, and still more preferably less than about 0.10 microns. The final GBIR, SBIR and SFQR value for the wafer is achieved by accurately mapping the thickness of the wafer and precision thinning the wafer using this map in the stock removal step. During the PACE stock removal step, preferably about 4–6 microns of stock is removed from the wafer and most preferably at least about 5.0 microns of stock is removed during the stock removal step. The amount of stock removal depends largely on the flatness of the incoming wafer as well as the damage on the surfaces of the incoming wafer.

Prior to and/or after stock removal, the wafer optionally may be cleaned to remove contaminants such as metals introduced during the initial flattening step and reaction by-products deposited on the wafer surface by the plasma during stock removal. The wafer may be cleaned using any suitable cleaning procedure that does not materially affect the thickness profile of the wafer. Such cleaning procedures are well known in the art and include, for example, the RCA method (described in F. Shimura, *Semiconductor Silicon Crystal Technology* (Academic Press 1989), pp. 189–191), or an appropriate water rinse.

After the PACE stock removal step, the wafer is subjected to a final polish (also referred to as "touch" polish) to further reduce the surface roughness. Plasma waferthinning processes will typically leave the surface of the silicon wafer with a significant amount of surface roughness as measured, for example, with an Atomic Force Microscope (AFM). Thus, it is preferred that the roughness of the plasma etched wafer surfaces be reduced to a value which is less than that level of roughness. Preferably, the root mean square surface roughness, RMS, is reduced to a value of about 0.3 nanometers over an area of 10 mm×10 mm, more preferably to a value of about 0.2 nanometers over an area of 10 mm×10 mm, and most preferably to a value of about 0.1 nanometers over an area of 10 mm×10 mm.

The final polish reduces nonspecularly reflected light (haze). An unpolished wafer includes high and low frequency components of roughness on its surface. The high frequency roughness causes high light scatter from the surface which causes haze. The final polishing minimizes the high and low frequency surface roughness and thereby reduces haze. The polishing may be carried out in a chemical/mechanical polishing process using, for example, a dilute colloidal silica slurry and conventional polishing equipment. The final polish step is to be distinguished from rough or intermediate polishing steps, which steps are not performed in the process flow of this invention. Final polishing, as used in this specification, refers to a process having several characteristics distinguishing it from rough or intermediate polishing. For example, final polishing exerts less polishing pressure than rough/intermediate polishing, typically between 2–4 psi, as compared to 6–9 in rough/intermediate. Final polishing uses a softer polishing pad, typically having a compressibility between 8 and 20 percent and a vertical pore height between 0.30–0.53 mm, as compared to the pads used in rough/intermediate, which typically have a compressibility between 5–6 percent and negligible vertical pore height. The slurry contains particles having a size that is more tightly controlled, typically between about 20–75 nm, as compared to about 10–150 nm in rough/intermediate. Final polishing uses a milder base chemical, such as ammonium hydroxide, as compared to sodium hydroxide in rough/intermediate. Preferably, less than about 1 micron of wafer thickness will be removed in the final polish step. If the silica slurry is not diluted prior to use, the polished wafer will not be as smooth as a wafer treated with a diluted slurry. A dilution of about one part silica slurry to about 10 parts deionized water is preferred.

Importantly, the process flow of this invention is more reliable than conventional process flows in producing wafers that satisfy the preferred flatness specifications discussed above and the specifications discussed in *The National Technology Roadmap for Semiconductors* (full citation given above). It is believed that the process flow is more reliable due to the fact that the plasma jet etching, high-gloss etching and PACE operations are overall more accurate than prior process flows which include lapping, grinding and rough/intermediate polishing. Thus, the yield of wafers within specification is expected to be at or near 100%.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method of processing a semiconductor wafer sliced from a single-crystal ingot and having front and back surfaces and a peripheral edge comprising the steps, in order, of:

(a) plasma jet etching the wafer to reduce the sub-surface wafer damage;

(b) high-gloss etching the wafer by subjecting the wafer to a high-gloss etchant that smooths the wafer such that surface roughness and nonspecularly reflected light are reduced;

(c) performing plasma assisted chemical etching (PACE) on the wafer to improve the flatness and the thickness uniformity of the wafer; and (d) final polishing the wafer to further reduce surface roughness and nonspecularly reflected light.

2. The method set forth in claim 1 wherein the processing of the wafer is free of any rough polishing step and is free of any lapping step.

3. The method set forth in claim 2 wherein the processing of the wafer is free of any grinding step.

4. The method set forth in claim 3 wherein the step of plasma jet etching the wafer includes plasma jet etching the front and back surfaces of the wafer.

5. The method set forth in claim 4 wherein the step of high-gloss etching the wafer includes high-gloss etching the front and back surfaces of the wafer.

6. The method set forth in claim 5 wherein the step of performing PACE on the wafer includes performing PACE on only one surface of the wafer.

7. The method set forth in claim 3 wherein the high-gloss etching step includes contacting the wafer with a potassium permanganate and hydrofluoric acid etchant and wherein the total thickness of the wafer is reduced by about 2–30 microns.

8. The method set forth in claim 7 wherein the high-gloss etching step reduces the total thickness of the wafer by about 2–20 microns.

9. The method set forth in claim 7 wherein the plasma jet etching step reduces the total thickness of the wafer by about 70–100 microns.

10. A method as set forth in claim 1 further comprising a step preceding said plasma jet etching of slicing the wafer from the single-crystal ingot and steps following said final touch polishing step of cleaning and packaging the wafer for shipment.

11. A method as set forth in claim 10 wherein the process is free of any lapping step or rough polishing step between slicing and the packaging step.

12. The method set forth in claim 11 wherein the processing of the wafer is free of any grinding step.

13. A method of manufacturing a semiconductor wafer comprising the steps, in order, of:

(a) slicing a single-crystal ingot to form a wafer having front and back surfaces and a peripheral edge;

(b) plasma jet etching the wafer to reduce the sub-surface wafer damage;

(c) high-gloss etching the wafer by subjecting the wafer to a high-gloss etchant that smooths the wafer such that surface roughness and nonspecularly reflected light are reduced;

(d) performing plasma assisted chemical etching (PACE) on the wafer to improve the flatness and the thickness uniformity of the wafer;

(e) final polishing the wafer to further reduce surface roughness and nonspecularly reflected light;

(f) final cleaning; and (g) packaging the wafer for shipment;
   the processing of the wafer being free of any rough polishing, lapping or grinding steps between said steps of slicing and packaging.

* * * * *